United States Patent
Wu

(10) Patent No.: US 7,056,796 B2
(45) Date of Patent: Jun. 6, 2006

(54) METHOD FOR FABRICATING SILICIDE BY HEATING AN EPITAXIAL LAYER AND A METAL LAYER FORMED THEREON

(75) Inventor: Bing-Chang Wu, Taipei County (TW)

(73) Assignee: United Microelectronics Corp. (TW)

( * ) Notice: Subject to any disclaimer, the term of this patent is extended or adjusted under 35 U.S.C. 154(b) by 41 days.

(21) Appl. No.: 10/725,523

(22) Filed: Dec. 3, 2003

(65) Prior Publication Data

US 2005/0124126 A1 Jun. 9, 2005

(51) Int. Cl.
*H01L 21/336* (2006.01)

(52) U.S. Cl. .................. 438/300; 438/607; 438/649; 438/682; 438/683; 438/738

(58) Field of Classification Search ............ 438/300, 438/479, 481, 500, 502, 507, 509, 592, 607, 438/649, 655, 682, 683, 738, 753
See application file for complete search history.

(56) References Cited

U.S. PATENT DOCUMENTS

| | | | |
|---|---|---|---|
| 6,190,976 B1 * | 2/2001 | Shishiguchi et al. | 438/299 |
| 6,228,728 B1 * | 5/2001 | Furukawa et al. | 438/300 |
| 6,440,762 B1 * | 8/2002 | Zhang | 438/20 |
| 6,797,602 B1 * | 9/2004 | Kluth et al. | 438/592 |
| 2001/0010962 A1 * | 8/2001 | Chen et al. | 438/305 |
| 2004/0175893 A1 * | 9/2004 | Vatus et al. | 438/300 |

* cited by examiner

*Primary Examiner*—Stephen W. Smoot

(57) ABSTRACT

A processing method for fabricating silicide is provided. First of all, a semiconductor structure having a semiconductor surface and an insulation surface is provided. Next, an epitaxial layer on the semiconductor surface is formed. And, the semiconductor structure is treated. The treat step is that the removal rate of the insulation surface is faster than the removal rate of the epitaxial layer. Then, a metal layer on the epitaxial layer is formed. Finally, heating the epitaxial layer forms silicide. The treatment step prevents the insulation surface from the formation of the silicide so as to reduce the degradation of device characteristics.

17 Claims, 5 Drawing Sheets

METHOD FOR FABRICATING SILICIDE BY HEATING AN EPITAXIAL LAYER AND A METAL LAYER FORMED THEREON

BACKGROUND OF THE INVENTION

1. Field of the Invention

The present invention generally relates to the semiconductor fabrication process, and more particularly to a method for fabricating silicide.

2. Description of the Prior Art

As the semiconductor processing dimensions are scaled down, the parasitic resistance such as contact and sheet resistance increases. To reduce such parasitic resistance, the silicide process attracted much attention. Among various suicides, cobalt silicide ($CoSi_2$) and titanium silicide ($TiSi_2$) are the most attractive and studied. They can be applied to the SALIDE (self-aligned silicide) process and show the lowest resistivity among the various silicides. For the improvement of thermal stability, epitaxially grown silicide films are required.

The prior art fabrication sequence is shown in FIG. 1A to 1D. FIG. 1A shows the basic semiconductor structure 101, which comprises a substrate 102 with two doped regions 103A,103B, a gate electrode 104 having an upper surface and side surfaces, a spacer 105 on each side surface of the gate electrode 104 leaving a portion of the doped regions 103A,103B exposed, and insulation devices 106A,106B blocking other semiconductor structures. FIG. 1B shows the depositing of epitaxial silicon 111 on the exposed portions of the doped regions 103A,103B and on the upper surface of the gate electrode 104, with substantially less epitaxial silicon and contamination 112 attached on the spacer 105 and insulation devices 106A, 106B. FIG. 1C shows the depositing of metal cobalt (Co) layer 121 on the epitaxial silicon 111. Finally, FIG. 1D shows the heating process. Furthermore, rapid thermal annealing (RTA) is extensively used in the silicidation or silicide formation step. And the cobalt silicide ($CoSi_2$) 131 is silicided on the epitaxial silicon 111.

By referring to FIG. 1D, the formation of a thick silicide layer causes a high junction leakage current and low reliability. The formation of a thick silicide consumes crystalline silicon from the underlying semiconductor substrate such that the thick silicide layer approaches, thereby generating a high junction leakage current. Moreover, the silicide 131 on the spacer 105 causes a bridging leakage. And it causes current leakage from the gate electrode 104 to the doped regions 103A, 103B.

SUMMARY OF THE INVENTION

In view of the prior art, there are many disadvantages in the traditional silicide process. This invention provides a processing method for improving silicide performance.

A processing method for fabricating silicide is provided. First of all, a semiconductor structure having a semiconductor surface and an insulation surface is provided. Next, an epitaxial layer on the semiconductor surface is formed. And, the semiconductor structure is treated. The treating step is that the removal rate of the insulation surface is faster than the removal rate of the epitaxial layer. Then, a metal layer on the epitaxial layer is formed. Finally, heating the epitaxial layer forms silicide. The treating step prevents the formation of the silicide on the insulation surface so as to reduce the degradation of the device characteristics.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Some sample embodiments of the invention will now be described in greater detail. Nevertheless, it should be recognized that the present invention could be practiced in a wide range of others.

A processing method for fabricating silicide is provided. First of all, a semiconductor structure having a semiconductor surface and an insulation surface is provided. Next, an epitaxial layer on the semiconductor surface is formed. And, the semiconductor structure is treated. The treating step is that the removal rate of the insulation surface is faster than the removal rate of the epitaxial layer. Then, a metal layer on the epitaxial layer is formed. Finally, heating the epitaxial layer forms silicide. The treating step prevents the insulation surface from the formation of the silicide so as to reduce the degradation of the device characteristics.

Figure 2A:
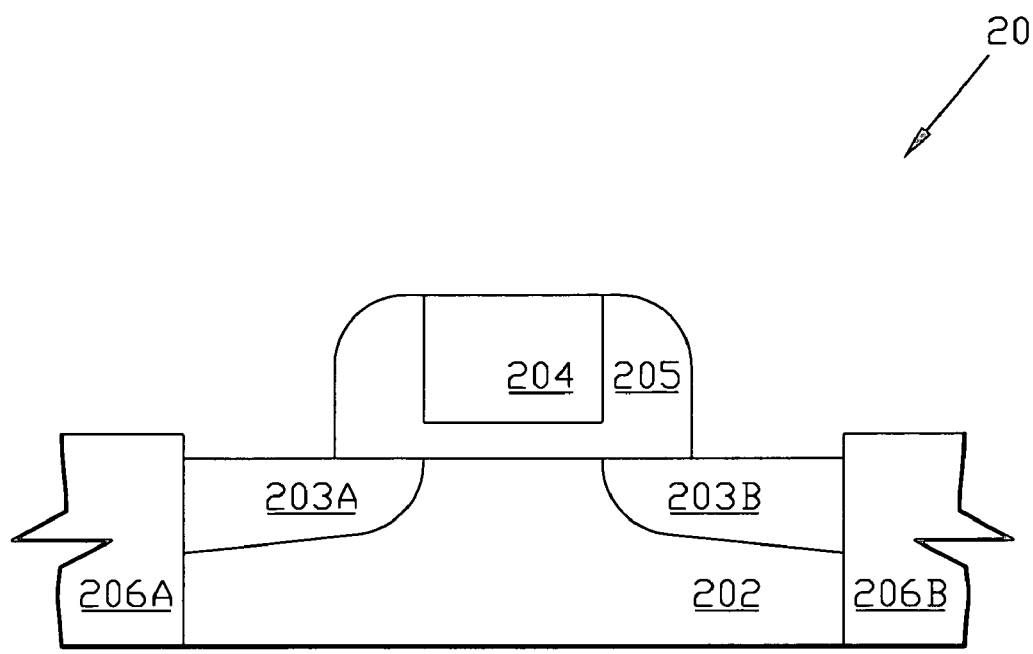
FIG. 2A to FIG. 2E show the schematically cross-sectional diagrams illustrating the fabrication process for a silicide structure in accordance with one embodiment of this invention.

One embodiment of this invention is shown in FIGS. 2A to 2E. FIG. 2A shows the basic semiconductor structure 201 implemented by any suitable methods, which includes a substrate 202 with multitudes of doped regions 203A, 203B, a gate electrode 204 having an upper surface and side surfaces, a spacer 205 on the side surface of the gate electrode 204 leaving a portion of the doped regions 203A, 203B exposed, and the insulation devices 206A,206B blocking other semiconductor structures. For the invention, the substrate 202 is made of any suitable semi-conductive materials, such as Si, Ge or SiGe, and it is Si in this embodiment. The doped region 203A,203B is implemented by implanting N type or P type dopants into the substrate 202, and N type dopants are used in this embodiment. The gate electrode 204 can be poly-crystallizations and it is poly-silicon in this embodiment. The spacer 205 and insulation devices 206A,206B can be silicon oxide or silicon nitride and it is silicon dioxide ($SiO_2$) in this embodiment. It is noted that the exposed portions of the doped regions 203A,203B and the upper surface of the gate electrode 204 are formed on the semiconductor surface in the embodiment, and the exposed portions of the spacer 205 and the exposed portions of the insulation devices 206A,206B are formed on the insulation surface.

Figure 2B:
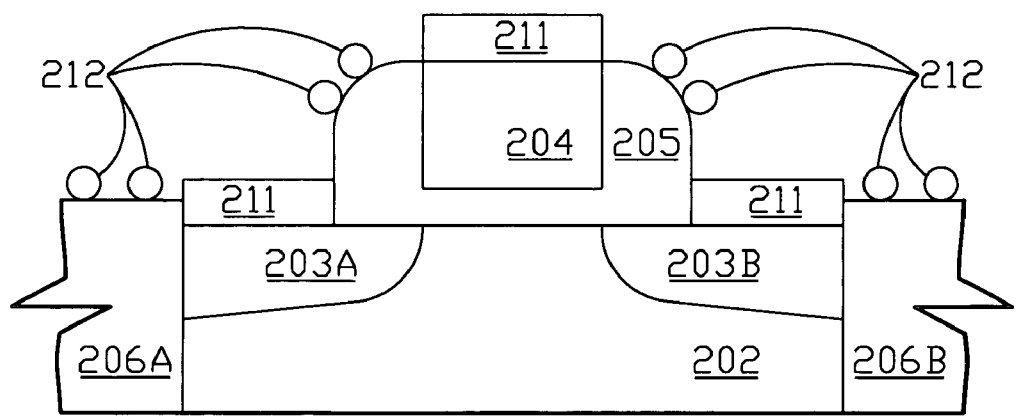

Depicted in FIG. 2B, an epitaxial layer, such as an epitaxial silicon layer 211 is formed on the semiconductor surface. During the selective deposition of the epitaxial silicon layer 211, some fragments of the epitaxial silicon or silicon-containing residue 212 may stay or form on the insulation surface. In order to prevent epitaxial silicon or silicon-containing residue 212 from attaching to the insulation surface, the following step provides a method for removal.

Figure 2C:
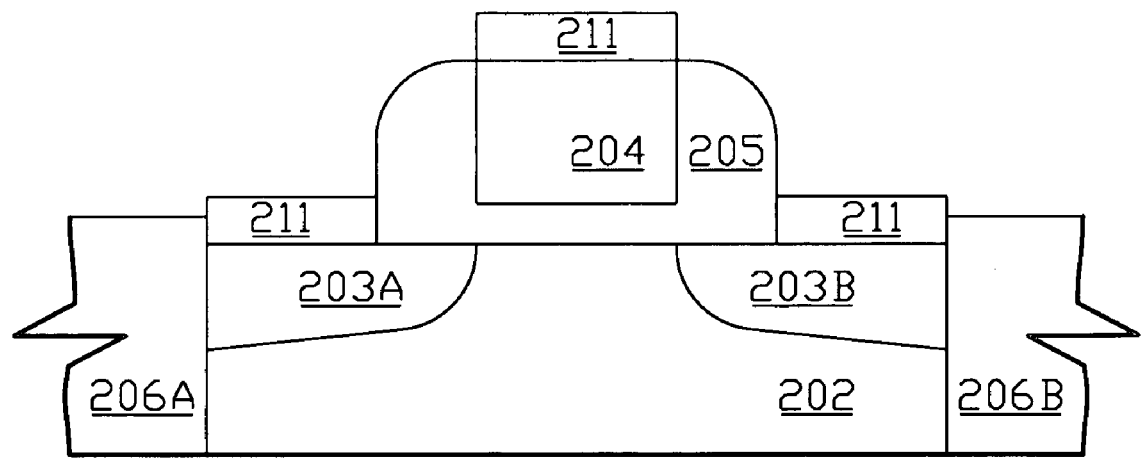

FIG. 2C shows the removing and preventing of the epitaxial silicon or silicon-containing residue 212 attached on the insulation surface. Herein, when removing, the etching process with DHF (Dilute HydroFluoric acid) is used. In the etching process of the embodiment, preferably about 10 Å of the insulation surface, on which may have the epitaxial silicon or silicon-containing residue 212, is removed. And in the meantime, less than 10 Å of the epitaxial silicon 211 surface on the semiconductor surface is removed. In other words, in the present invention, the removal rate of the epitaxial layer is slower than the removal rate of the insulation surface.

In the embodiment, the removal rate, such as an etching rate, is considered. For the wet etching method, DHF is selected on the grounds of the high ratio of etch selectivity of $SiO_2$ (insulation surface) to that of the epitaxial Si. In other embodiments, the BOE (Buffer Oxide Etcher) is used for executing the wet etching process and there are many preparations for the different insulation surface and the semiconductor surface. Furthermore, for the dry etching method, fluorine compounded preparations can be used in the present invention. No matter what preparation is used, the removal rate of the insulation surface is faster than the removal rate of the epitaxial layer.

Figure 2D:
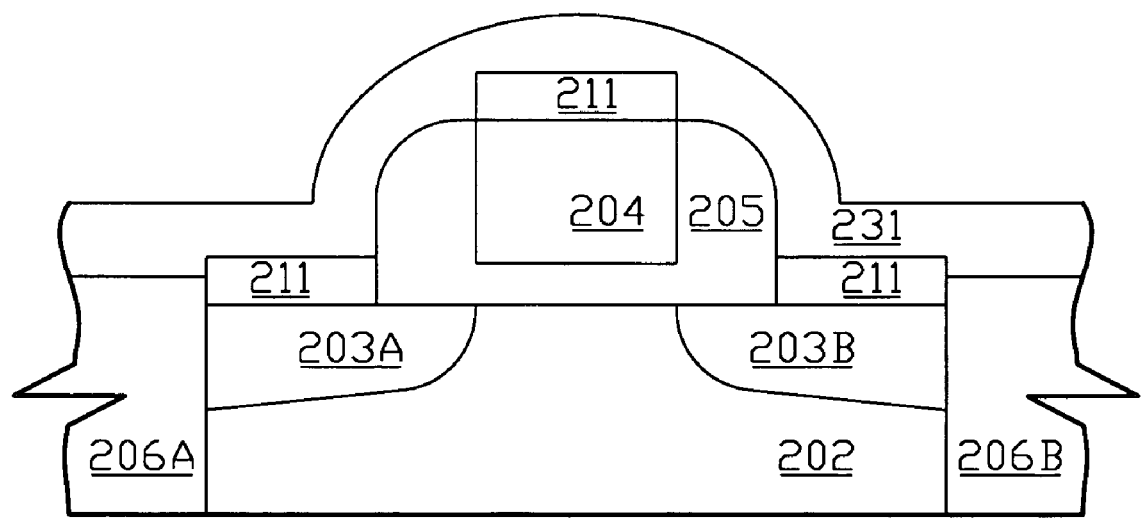

FIG. 2D shows a metal layer 231, such as a cobalt (Co) layer, formed on the epitaxial silicon 211 by any suitable method, such as a deposition method. Finally, shown in FIG. 2E, a heating process is executed on the semiconductor structure. In the present invention, rapid thermal annealing (RTA) is extensively used for the silicidation or silicide formation step. In accordance with this embodiment, the RTA step is implemented at a temperature near 650° C. for about 20 minutes and forms silicide-$COSi_2$ 241. In another embodiment for metal titanium (Ti), the RTA is followed by a two-step. The first step is annealing, for example, at a temperature near 650° C. for about 20 minutes in a nitrogen atmosphere, during which nitrogen reacts with titanium to form titanium nitride (TiN) at the surface of the metal, while titanium reacts with epitaxial silicon and forms silicide in those regions where it comes in direct contact with epitaxial silicon. At temperatures, for example, between 650–750° C., a high-resistivity phase of $TiSi_2$ (called C49) forms more rapidly than TiN in the exposed epitaxial silicon regions, while negligible reaction with epitaxial silicon occurs where the metal is in contact with silicon dioxide ($SiO_2$) or silicon nitride (SiN). The metal composition in contact with the insulation surface consists predominantly of TiN and unreacted titanium (Ti). It is removed with a peroxide solution, leaving the silicided regions intact.

Figure 1A:
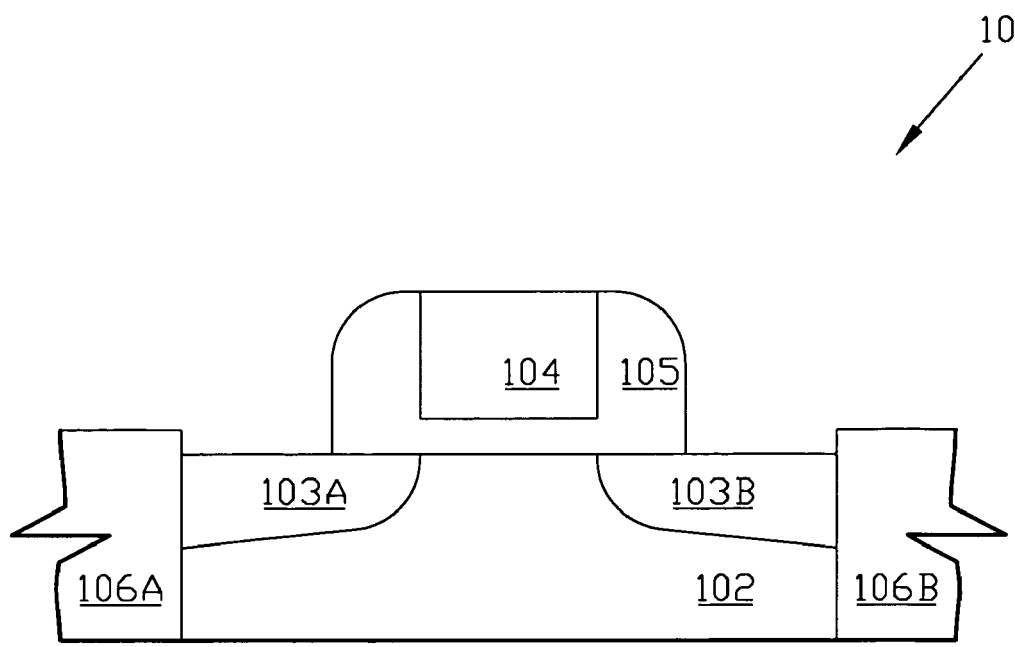
FIG. 1A to FIG. 1D show the schematically cross-sectional diagrams illustrating the fabrication process for a silicide structure in accordance with the prior art.
Figure 1B:
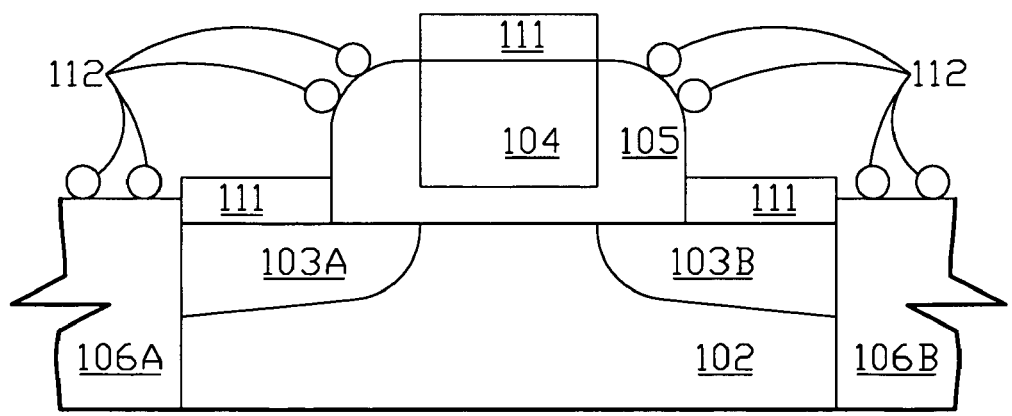
Figure 1C:
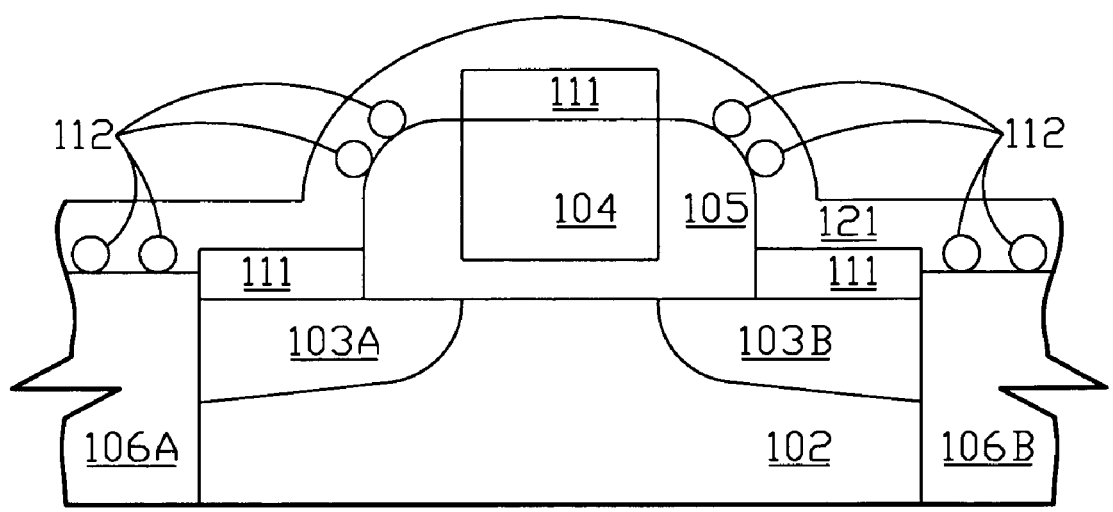
Figure 1D:
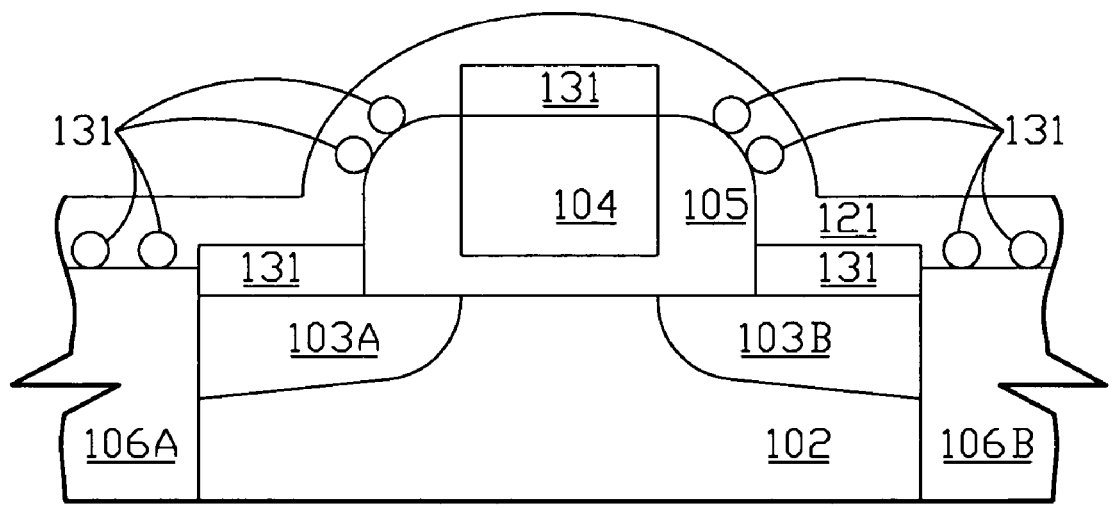
Figure 2E:
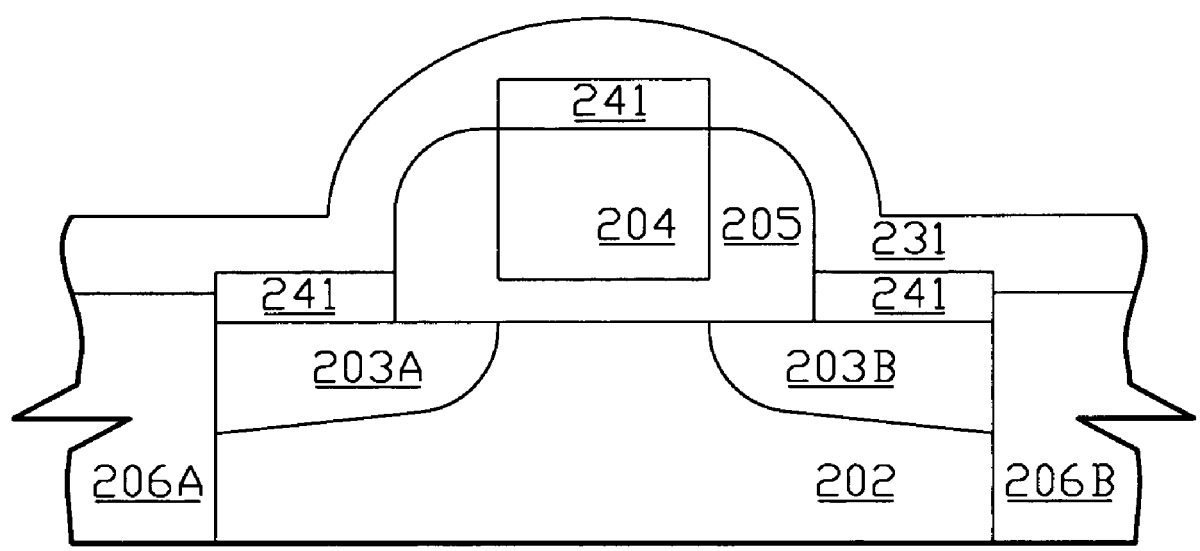

Comparison of FIG. 1D (prior art) and FIG. 2E, no residue is left on the exposed portions of the insulation surface, and the silicide layer becomes a little thinner. Which means the bridging leakage has been improved and the semiconductor structure gets a higher reliability.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A processing method for forming silicide comprising:
    providing a semiconductor structure having a semiconductor surface and an insulation surface;
    forming an epitaxial layer on said semiconductor surface together with residues of said epitaxial layer on said insulation surface;
    treating said semiconductor structure, wherein said treating step is that a removal rate of said insulation surface on which has said residues of said epitaxial layer is higher than a removal rate of said epitaxial layer on said semiconductor surface to remove said residues of said epitaxial layer together with a portion of said insulation surface;
    forming a metal layer on said epitaxial layer; and
    heating said epitaxial layer for forming silicide.

2. The processing method according to claim 1, wherein providing said semiconductor structure step comprises forming a substrate and forming a gate electrode for forming a portion of said semiconductor structure.

3. The processing method according to claim 2, wherein forming said semiconductor surface step comprises forming a doped region in said substrate for forming a portion of said semiconductor surface.

4. The processing method according to claim 2, wherein forming said semiconductor surface step comprises forming an upper surface on said gate electrode for forming a portion of said semiconductor surface.

5. The processing method according to claim 2, wherein forming said insulation surface step comprises forming a spacer on the sidewall of said gate electrode for forming a portion of said insulation surface.

6. The processing method according to claim 2, wherein forming said insulation surface step comprises forming an insulation device in said substrate for forming a portion of said insulation surface.

7. The processing method according to claim 1, wherein forming said epitaxial layer comprises forming epitaxial silicon.

8. The processing method according to claim 1, wherein forming said epitaxial layer comprises forming an epitaxial silicon compound.

9. The processing method according to claim 1, wherein said treating step comprises executing wet etching for removing a portion of said insulation surface.

10. The processing method according to claim 9, wherein said wet etching comprises using fluorine-containing solution.

11. The processing method according to claim 1, wherein said treating step comprises executing dry etching for removing a portion of said insulation surface.

12. The processing method according to claim 11, wherein said dry etching comprises using a fluorine-containing compound.

13. The processing method according to claim 1, wherein forming said metal layer comprises forming a titanium (Ti) layer.

14. The processing method according to claim 1, wherein forming said metal layer comprises forming a cobalt (Co) layer.

15. A processing method for forming silicide comprises:
    providing a silicon substrate;
    forming a polysilicon gate electrode on said silicon substrate;
    forming an insulation spacer on a sidewall of said polysilicon gate electrode;
    forming an epitaxial layer on said silicon substrate and an upper surface of said polysilicon gate electrode together with residues of said epitaxial layer on said insulation spacer;
    etching said residues of said epitaxial layer, epitaxial layer and a portion of said insulation spacer, wherein a removal rate of said insulation spacer on which has said residues of said epitaxial layer is higher than a removal rate of said epitaxial layer on said silicon substrate and said upper surface of said polysilicon gate electrode to remove said residues of said epitaxial layer together with said portion of said insulation spacer;

forming a metal layer on said epitaxial layer; and heating said epitaxial layer for performing salicidation on said upper surface of said polysilicon gate electrode and said silicon substrate.

16. The processing method according to claim 15, wherein said etching step comprises executing wet etching with fluorine-containing solution.

17. The processing method according to claim 15, wherein said etching step comprises executing dry etching with fluorine-containing compound.

\* \* \* \* \*